(12) United States Patent
Tan et al.

(10) Patent No.: US 8,993,407 B2
(45) Date of Patent: Mar. 31, 2015

(54) COMPACT LOCALIZED RRAM CELL STRUCTURE REALIZED BY SPACER TECHNOLOGY

(71) Applicants: Shyue Seng Tan, Singapore (SG); Eng Huat Toh, Singapore (SG); Elgin Quek, Singapore (SG)

(72) Inventors: Shyue Seng Tan, Singapore (SG); Eng Huat Toh, Singapore (SG); Elgin Quek, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 132 days.

(21) Appl. No.: 13/683,779

(22) Filed: Nov. 21, 2012

(65) Prior Publication Data

US 2014/0138605 A1     May 22, 2014

(51) Int. Cl.
*H01L 45/00*     (2006.01)
*H01L 27/24*     (2006.01)

(52) U.S. Cl.
CPC ............ *H01L 45/1691* (2013.01); *H01L 45/08* (2013.01); *H01L 45/1233* (2013.01); *H01L 45/146* (2013.01); *H01L 45/1675* (2013.01); *H01L 27/2445* (2013.01); *H01L 27/2463* (2013.01)
USPC .............................................. 438/433; 257/4

(58) Field of Classification Search
CPC .. H01L 27/281; H01L 29/792; H01L 45/1691
USPC .......................................................... 438/433
See application file for complete search history.

(56) References Cited

U.S. PATENT DOCUMENTS

| | | | |
|---|---|---|---|
| 2007/0066014 A1* | 3/2007 | Park et al. | 438/257 |
| 2007/0262382 A1* | 11/2007 | Ishii et al. | 257/350 |
| 2010/0237404 A1* | 9/2010 | Toba et al. | 257/326 |
| 2014/0070159 A1* | 3/2014 | Tan et al. | 257/4 |

* cited by examiner

*Primary Examiner* — Kimberly Rizkallah
*Assistant Examiner* — Mounir Amer
(74) *Attorney, Agent, or Firm* — Ditthavong & Steiner, P.C.

(57) ABSTRACT

An RRAM is disclosed with a vertical BJT selector. Embodiments include defining a STI region in a substrate, implanting dopants in the substrate to form a first polarity well around and below a bottom portion of the STI region, a second polarity channel over the well on opposite sides of the STI region, and a first polarity active area over each channel at the surface of the substrate, forming an RRAM liner on the active area and STI region, forming a sacrificial top electrode on the RRAM liner, forming spacers on opposite sides of the sacrificial top electrode, implanting a second polarity dopant in the active area on opposite sides of the sacrificial top electrode, forming a silicon oxide adjacent the spacers, removing at least a portion of the sacrificial top electrode forming a cavity, forming in the cavity inner spacers adjacent the spacers and a top electrode.

13 Claims, 6 Drawing Sheets

US 8,993,407 B2

COMPACT LOCALIZED RRAM CELL STRUCTURE REALIZED BY SPACER TECHNOLOGY

TECHNICAL FIELD

The present disclosure relates to semiconductor memories. The present disclosure is particularly applicable to nonvolatile resistive random access memories (RRAMs).

BACKGROUND

Present flash technologies have encountered significant challenges for scaling such as scaling of program/erase (P/E) voltage, speed, reliability, and high densities with non-volatile data. Attempts to solve such issues have included employing RRAMs due to their scalability, highly competitive speed, endurance, and retention properties. However, RRAMs suffer from poor resistance uniformity, smaller memory margin, and poor performance back-end-of-line (BEOL) cell selectors.

The poor resistance distribution has been attributed to more filament current paths in a planar device, which leads to increased variations between set and reset, since some cells give more current paths than others. Single transistor single resistor (1T1R) RRAMs, which are desirably bipolar and have a high access current, also have a large cell size of $8F^2$ or higher, are not easily scalable, and have a planar memory margin. Single diode single resistor (1D1R) RRAMs, on the other hand, have a smaller cell size of $4F^2$ or higher, and are easily scalable, but are unipolar, have a low access current, and have a planar memory margin. In addition, 1D1R RRAMs employ metal oxide diodes or organic diodes, which are compatible with back-end-of-line (BEOL) processes because of processing temperatures less than 400° C. However, the diodes of such materials are not tunable, have inferior diode performance (i.e., low forward current due to large band-gap), which leads to larger cell area and a high Vdd of 3 to 4.5 V, which is not compatible with low Vdd technology.

Attempts to improve the resistance distribution include a plug bottom electrode instead of a planar bottom electrode to limit the number of filament current paths for memory cells. The plug bottom electrode improves reset current distribution and memory margin by a factor of about four. However, RRAMs using bottom plugs are not easily scalable.

A need therefore exists for methodology enabling fabrication of easily scalable RRAMs which have a small cell size, bipolar access, and improved resistance distribution and memory margin, and the resulting product.

SUMMARY

An aspect of the present disclosure is a method of fabricating a compact RRAM using a vertical bipolar junction transistor (BJT) as an access device.

Another aspect of the present disclosure is a compact RRAM using a vertical BJT as an access device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: defining a shallow trench isolation (STI) region in a substrate; implanting dopants in the substrate to form a well of a first polarity around and below a bottom portion of the STI region, a channel of a second polarity over the well on opposite sides of the STI region, and an active area of the first polarity over each channel of second polarity at the surface of the substrate; forming an RRAM liner on the active area and STI region; forming a sacrificial top electrode on the RRAM liner; forming spacers on opposite sides of the sacrificial top electrode and RRAM liner; implanting a dopant of the second polarity in the active area on opposite sides of the sacrificial top electrode; forming a silicon oxide adjacent the spacers; removing at least a portion of the sacrificial top electrode, forming a cavity; forming inner spacers, adjacent the spacers, in the cavity; and forming a top electrode in the cavity.

Aspects of the present disclosure include forming the STI regions extending in a first direction and forming the RRAM liner extending in a second direction perpendicular to the first direction. Other aspects include removing all of the sacrificial top electrode prior to forming the inner spacers; and forming the inner spacers adjacent a bottom section of the spacers. Further aspects include removing one third of the sacrificial top electrode prior to forming the inner spacers; forming the inner spacers adjacent a top section of the spacers; etching fins below the spacers subsequent to forming the inner spacers; and forming the top electrode subsequent to etching the fins. Another aspect includes forming the RRAM liner to a thickness of 1 nanometer (nm) to 100 nm. Additional aspects include the RRAM liner including an oxide of a transition metal. Other aspects include forming the inner spacers by: conformally depositing $SiO_2$; and blanket etching the $SiO_2$.

Another aspect of the present disclosure is a method including: defining a shallow trench isolation (STI) region in a substrate; implanting dopants in the substrate to form a well of a first polarity around and below a bottom portion of the STI region, a channel of a second polarity over the well on opposite sides of the STI region, and an active area of the first polarity over each channel of second polarity at the surface of the substrate; forming an RRAM liner on the active area and STI region; forming a top electrode on the RRAM liner; forming spacers on opposite sides of the top electrode and RRAM liner; implanting a dopant of the second polarity in the active area on opposite sides of the top electrode; forming a silicon oxide adjacent the spacers; removing a portion of the top electrode, forming a first cavity; forming inner spacers, adjacent the spacers, in the cavity; etching fins below the inner spacers, forming a second cavity; filling the second cavity with an interlayer dielectric; removing the inner spacers; and filling the first cavity with metal.

Aspects include forming the STI regions extending in a first direction and forming the RRAM liner extending in a second direction perpendicular to the first direction. Further aspects include removing one third of the top electrode to form the first cavity. Other aspects include forming the RRAM liner to a thickness of 1 nanometer (nm) to 100 nm. Another aspect includes the RRAM liner including an oxide of a transition metal. Additional aspects include forming the inner spacers by: conformally depositing $SiO_2$; and blanket etching the $SiO_2$.

Another aspect of the present disclosure is a device including: a substrate; a well of a first polarity in the substrate; a shallow trench isolation (STI) region formed in the substrate extending partially into the well; a channel of a second polarity in the substrate, over the well, at opposite sides of the STI region; an active area of the first polarity in the substrate over the channel at opposite sides of the STI region; an RRAM liner on the active area and STI region; a top electrode on the RRAM liner; spacers on opposite sides of the RRAM liner and top electrode; and doped regions of the second polarity in the substrate adjacent the spacers, laterally remote from the RRAM liner.

Aspects include a device having an RRAM liner including an oxide of a transition metal. A further aspect includes a thickness of the RRAM liner being 1 nm to 100 nm. Another aspect a device including a top electrode, with the top electrode including a transition metal, titanium nitride (TiN), TiN/Ti, or polysilicon. Additional aspects include a device having spacers, with each spacer including a top section and a bottom section, the device further including inner spacers on the RRAM liner, adjacent the bottom section of the spacers, wherein the top electrode is between the inner spacers and between the top sections of the spacers. Other aspects include a device having spacers, with each spacer including a top section and a bottom section, the device further including: fins on the RRAM liner adjacent the bottom section of the spacers; and inner spacers on the fins adjacent the top section of the spacers, wherein the top electrode is between the inner spacers and between the fins. Further aspects include a device having a top electrode and spacers, with each spacer including a top section and a bottom section, wherein the top electrode includes a portion adjacent the bottom section of each spacer, the device further including: an interlayer dielectric (ILD) between the top electrode portions; and a metal layer above the top electrode portions and the ILD, between the top portions of the spacers.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 6A and 1B through 6B schematically illustrate top views and cross-sectional views, respectively, of a process flow, in accordance with an exemplary embodiment;

DETAILED DESCRIPTION

Figure 1B:
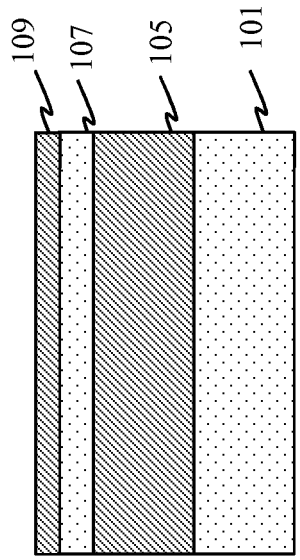

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of difficult scalability, low access current, large cell size and/or unipolarity, as well as poor resistance uniformity and smaller memory margin attendant upon fabricating a 1T1R or a 1D1R RRAM. In accordance with embodiments of the present disclosure, a compact RRAM is formed using a vertical BJT.

Methodology in accordance with embodiments of the present disclosure includes defining an STI region in a substrate and implanting dopants in the substrate to form a well of a first polarity around and below a bottom portion of the STI region, a channel of a second polarity over the well on opposite sides of the STI region, and an active area of the first polarity over each channel of second polarity at the surface of the substrate. Next, an RRAM liner is formed on the active area and STI region. A sacrificial top electrode is then formed on the RRAM liner. After spacers are formed on opposite sides of the sacrificial top electrode and RRAM liner, a dopant of the second polarity is implanted in the active area on opposite sides of the sacrificial top electrode. Silicon oxide is formed adjacent the spacers, and at least a portion of the sacrificial top electrode is removed, forming a cavity Inner spacers are then formed, adjacent the spacers, in the cavity, and a top electrode is formed in the cavity.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 6A schematically illustrate a top view for a process flow in accordance with an exemplary embodiment, and FIGS. 1B through 6B schematically illustrate corresponding cross-sectional views of the process flow. Adverting to FIGS. 1A and 1B, STI regions 103 are defined on a P-type substrate 101. The STI regions may be formed to a depth of 100 nanometer (nm) to 800 nm and to a width of 30 nm to 100 nm, depending on the technology node, and may be formed, for example, of $SiO_2$, silicon nitride ($Si_3N_4$), or silicon oxynitride (SiON). N-wells 105 are formed around the bottom portions of the STI regions by implanting N-type dopants (e.g., phosphorus (P), arsenic (As), etc.) at a dosage of 1E11 to 5E12 with an energy of 50 keV to 300 keV depending on the STI depth and type of dopant. Next, a P-channel 107 is formed over the N-wells on opposite sides of the STI region by implanting P-type dopant (e.g., boron (B), boron difluoride ($BF_2$), indium (In), etc.) at a dosage of 1E12 to 1E14 and with an energy of 5 keV to 20 keV. Then, a shallower N-type implant is performed over the P-channel on opposite sides of the STI region by implanting N-type dopants (e.g., P, As, etc.) at a dosage of 1E12 to 1E14 and with an energy of 1 keV to 10 keV, forming N-type active area 109.

Figure 2B:
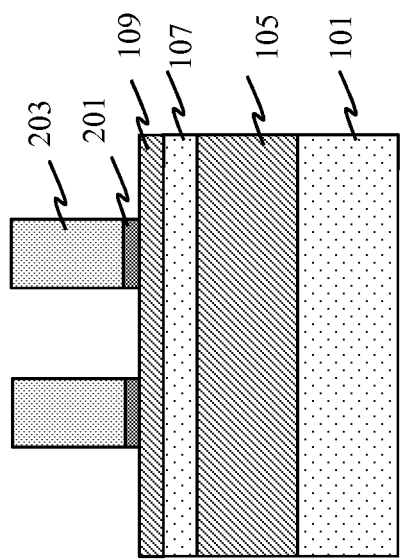
Figure 1A:
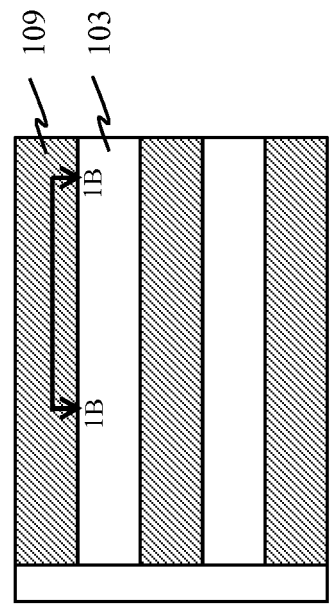
Figure 2A:
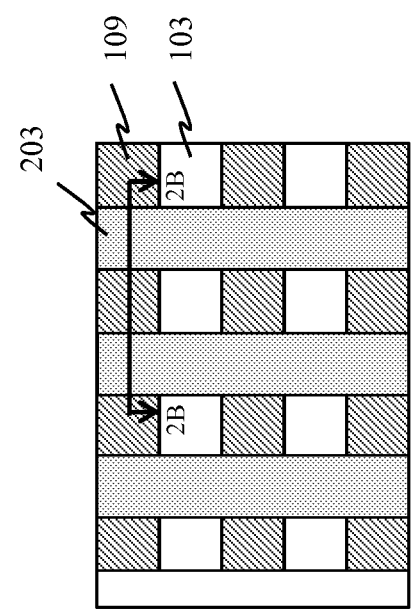

As illustrated in FIGS. 2A and 2B, RRAM liners 201 and sacrificial top electrodes 203 are deposited and patterned on the N-type active area 109 and STI regions 103, perpendicular thereto. RRAM liner 201 may be formed of nickel oxide ($NiO_x$), aluminum oxide ($AlO_x$), hafnium oxide ($HfO_x$), tungsten oxide ($WO_x$), tantalum oxide ($TaO_x$), vanadium oxide ($VO_x$), and copper oxide ($CuO_x$), or a combination thereof. The RRAM liner 201 may be formed to a thickness of 1 nm to 100 nm. Sacrificial top electrodes 203 may be formed of amorphous silicon (a-Si) or polysilicon (poly-Si), with a height of 50 nm to 500 nm, and a width of 20 nm to 1 μm and a length of 20 nm to 1 μm. Alternatively, the RRAM liner 201 may be formed of multiple layers (not shown for illustrative convenience). For example, the RRAM liner may include a bottom electrode formed on and perpendicular to the N-type active area 109 and STI regions 102, an interface material formed on the bottom electrode, and the RRAM material itself formed on the interface material.

Figure 3B:
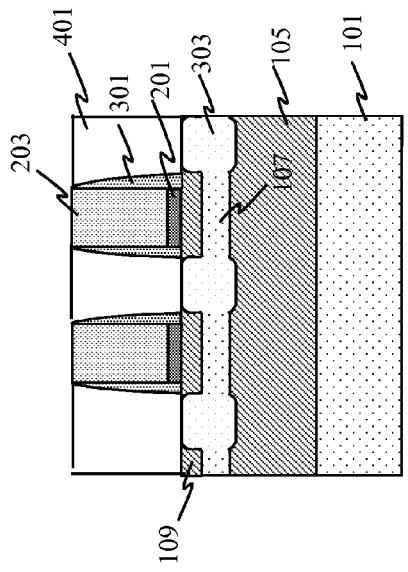
Figure 3A:
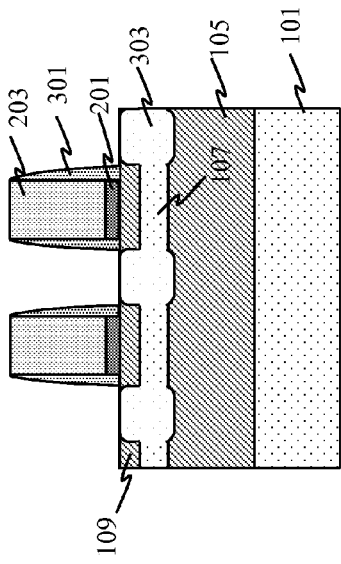

Next, self-aligned $Si_3N_4$ spacers 301 are formed on opposite sides of each sacrificial top electrode 203, as illustrated in FIGS. 3A and 3B. Subsequently, a P-type dopant (e.g., B, $BF_2$, In, etc.) is implanted between the spacers at a dosage of 1E12 to 1E14 and with an energy of 1 keV to 20 keV to form P-type regions 303. Alternatively, a multiple P-type implant with different energy depths can be used to form P-type regions 303. The dopants are then activated, for example by a micro-second anneal or a rapid thermal anneal (RTA) at a temperature of 1100° C. to 1250° C.

Figure 4B:
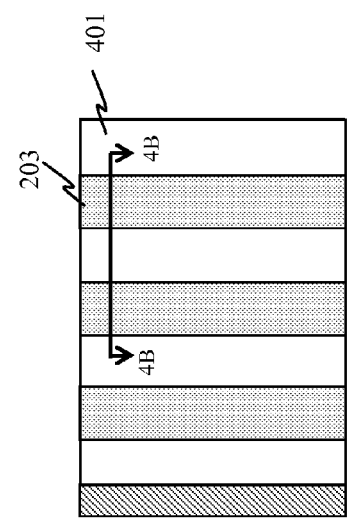
Figure 4A:
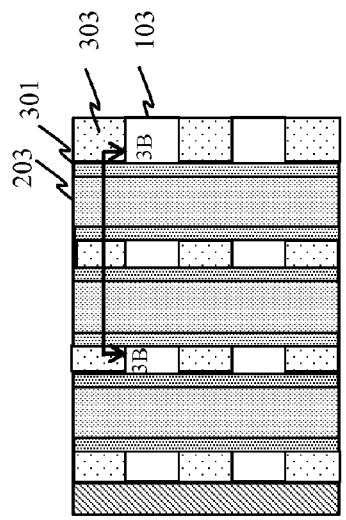

Adverting to FIGS. 4A and 4B, $SiO_2$ 401 is deposited over the entire substrate, filling the gaps between spacers 301. Then, chemical mechanical polishing (CMP) is performed, stopping on sacrificial top electrode 203.

Figure 5B:
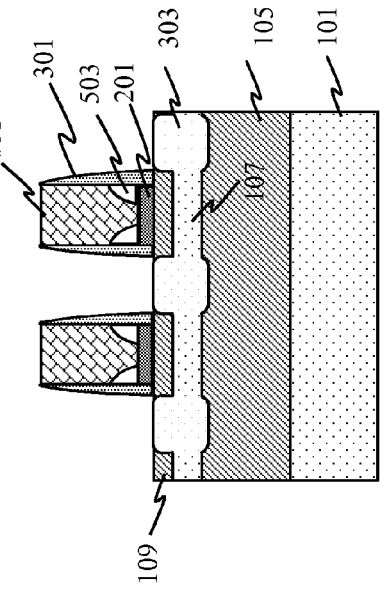
Figure 5A:
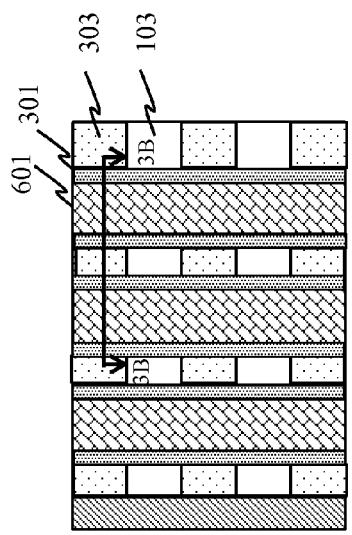

As illustrated in FIGS. 5A and 5B, sacrificial top electrodes 203 are then removed by a wet etch or dry etch process, forming cavities 501. Other surfaces are protected by $SiO_2$ 401 during the etching of sacrificial top electrodes 203. $SiO_2$ is then conformally deposited, for example by chemical vapor deposition (CVD) or atomic layer deposition (ALD). The thickness of the $SiO_2$ may be optimized to less than or equal to one third of the opening for cavity 501. The $SiO_2$ is then etched back, with a blanket etch, to form inner spacers 503.

Figure 6B:
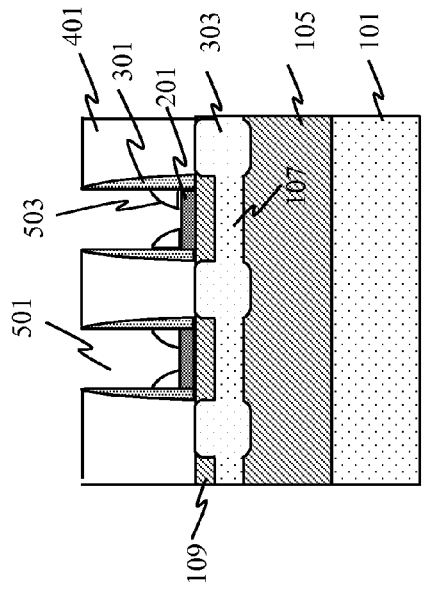
Figure 6A:
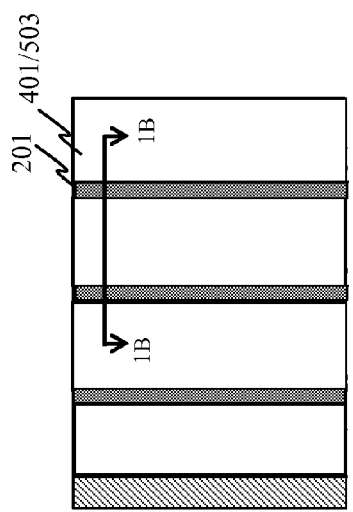

As shown in FIGS. 6A and 6B, a top electrode material is deposited, filling the cavities 501. CMP is performed, stopping on $SiO_2$ 401, forming top electrodes 601. Top electrode 601 may, for example, be formed of platinum (Pt), titanium nitride (TiN), TiN/titanium (Ti), ruthenium (Ru), nickel (Ni), tungsten (W), aluminum (Al), copper (Cu), or polysilicon. Then, remaining $SiO_2$ is optionally removed, and back-end-of-line (BEOL) processing may continue.

Alternatively, instead of RRAM liner 201 being formed prior to sacrificial top electrode 203, a bottom electrode (not shown for illustrative convenience) may be formed on the N-type active area 109 and STI regions 103, perpendicular thereto. The above process flow may then continue through formation of inner spacers 503 (with the bottom electrode instead of RRAM liner 201). Then, RRAM liner 201 may be deposited on the bottom electrode, and top electrode 601 may be formed on RRAM liner 201, filling the rest of cavity 501.

FIGS. 7A through 7E schematically illustrate cross-sectional views of a process flow, in accordance with another exemplary embodiment. Adverting to FIG. 7A, after $SiO_2$ 401 is deposited and CMP is performed, as illustrated in FIGS. 4A and 4B, the sacrificial top electrode 203 is partially removed, forming cavity 701. For example, cavity 701 may be formed to a depth of about one third the thickness of the sacrificial top electrode.

Figure 7A:
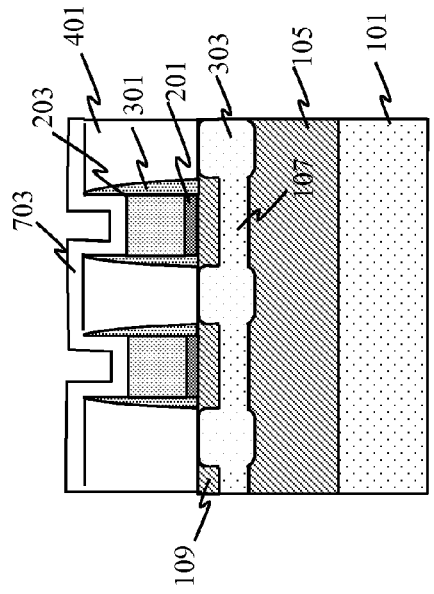
FIGS. 7A through 7E schematically illustrate cross-sectional views of a process flow, in accordance with another exemplary embodiment.
Figure 7B:
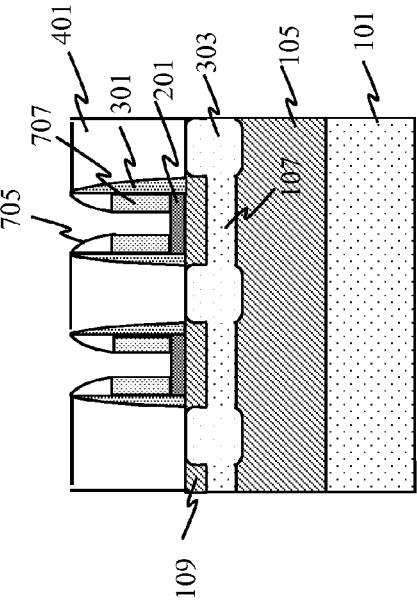
Figure 7C:
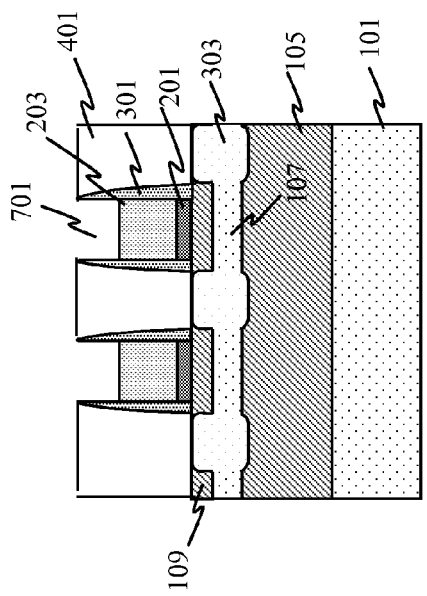

As illustrated in FIG. 7B, a spacer material 703, such as $SiO_2$, SiON, or $Si_3N_4$, is conformally deposited to a thickness about one third the width of cavity 701. Inner spacers 705 are then etched, as illustrated in FIG. 7C.

Figure 7D:
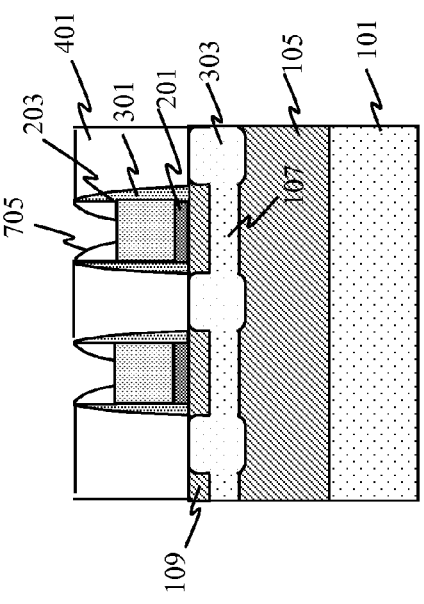
Figure 7E:
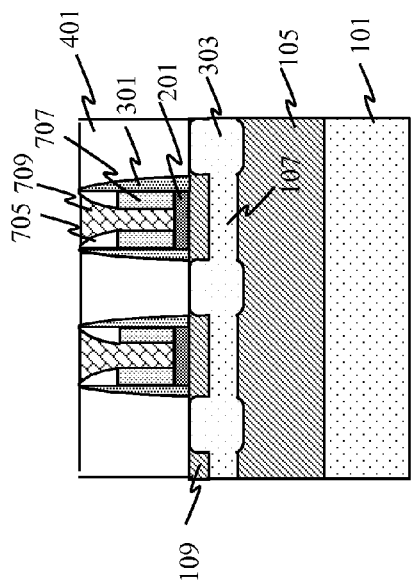

Adverting to FIG. 7D, sacrificial top electrode 203 is etched using inner spacers 705 as a mask to form fins 707. The gap formed between the fins 707 and the remainder of cavity 701 are then filled with a top electrode 709, as illustrated in FIG. 7E. Remaining $SiO_2$ is optionally removed, and back-end-of-line (BEOL) processing may continue.

Figure 8B:
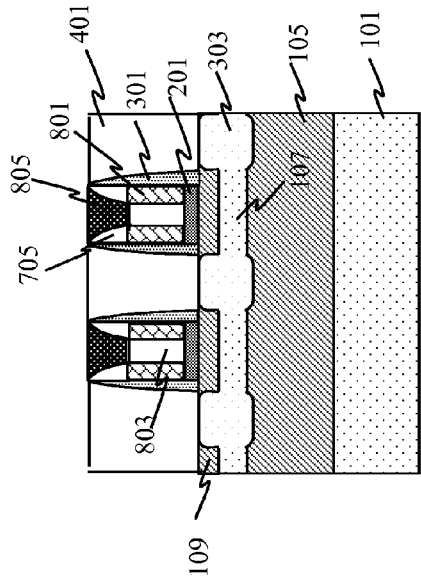
FIGS. 8A through 8B schematically illustrate cross-sectional views of a process flow, in accordance with another exemplary embodiment.
Figure 8A:
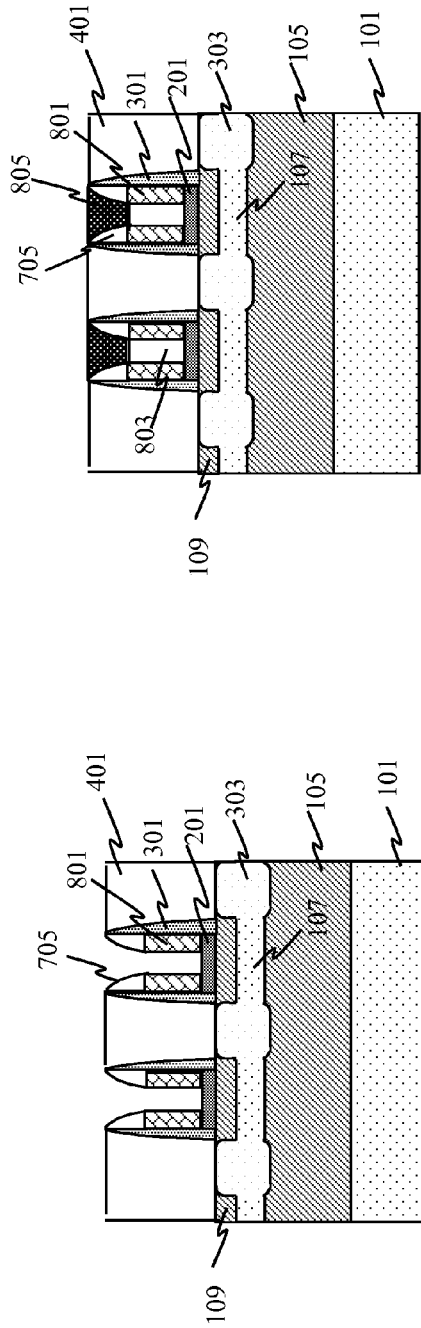

Cross-sectional views of a process flow, in accordance with another exemplary embodiment, are illustrated in FIGS. 8A through 8B. The process begins substantially the same as the second embodiment except that a top electrode, for example of Pt, TiN, TiN/Ti, Ru, Ni, W, Al, Cu, or polysilicon, is formed on RRAM liner 201, etched back, and formed into fins 801, instead of sacrificial top electrode 203, as illustrated in FIG. 8A.

Adverting to FIG. 8B, the gap formed between fins 801 is filled with an ILD 803, and the gap between inner spacers 705 is filled with a metal 805. Then, remaining $SiO_2$ is optionally removed, and back-end-of-line (BEOL) processing may continue.

Figure 9A:
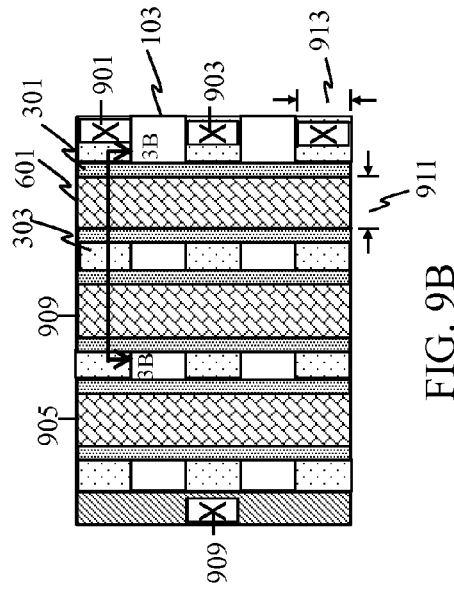
FIGS. 9A through 9C schematically illustrate a layout scheme for the structures formed by the processes of the first and second embodiments.
Figure 9B:
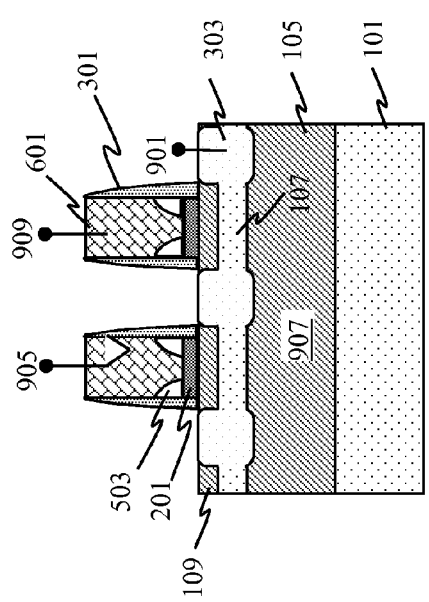
Figure 9C:
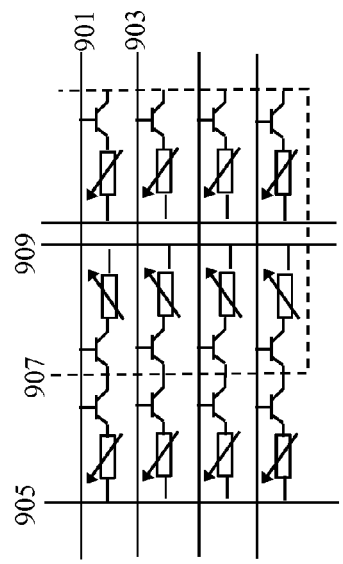

A layout of RRAMs of FIGS. 6A and 6B is illustrated in FIGS. 9A through 9C. As shown in FIGS. 9A through 9C, a first word line 901 is connected to the P-type region 303 on one side of STI region 103, and a second word line 903 is connected to the P-type region 303 on the other side of STI region 103. A first bit line 905 is connected to a first top electrode 601, and a second bit line 909 is connected to a second top electrode 601. A select line 907 is formed in N-well 105. For a unit cell, the width 911 of top electrode 601 and the width 913 of P-type region 303 is F. The unit cell area is therefore $2F \times 2F = 4F^2$, which yields a high density memory cell.

Read, set, and reset operations of the RRAM at the STI can be achieved by passing current through selected BJTs and RRAM. For example, for a read operation, a high read voltage may be applied to the selected bit line, a select read voltage may be applied to the selected word line, and a low voltage may be applied to the select line. Similarly, for a set operation, a high set voltage may be applied to the selected bit line, a select set voltage may be applied to the selected word line, and a low voltage may be applied to the select line. For reset operations, a select reset voltage may be applied to the selected word line. Then, for a unipolar reset operation, a high reset voltage may be applied to the selected bit line and a low voltage may be applied to the select line, whereas for a bipolar operation, a low reset voltage may be applied to the selected bit line and a high voltage may be applied to the select line. In addition, for forming operations, a high forming voltage may be applied to the selected bit line, a select forming voltage may be applied to the selected word line, and a low voltage may be applied to the select line. For all forming, read, set, and reset operations, unselected word lines and unselected bit lines may be floating.

The embodiments of the present disclosure can achieve several technical effects, such as a localized structure which enables limited filament current paths to control distribution which in turn improves the memory margin, direct bipolar access to the RRAM with a high access current through a high performance silicon-based selector (the BJT), increased scalability being independent from the gate oxide and gate length, compatibility with front-end-of-line (FEOL) processes, and high density with a smallest unit cell area of $4F^2$. Further, the structure can be easily controlled by mature processes such as implantation and spacer techniques. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or in any memory product. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    defining a shallow trench isolation (STI) region in a substrate;
    implanting dopants in the substrate to form a well of a first polarity around and below a bottom portion of the STI region, a channel of a second polarity over the well on opposite sides of the STI region, and an active area of the first polarity over each channel of second polarity at the surface of the substrate;
    forming an RRAM liner on the active area and STI region;
    forming a sacrificial top electrode on the RRAM liner;
    forming spacers on opposite sides of the sacrificial top electrode and RRAM liner;
    implanting a dopant of the second polarity in the active area on opposite sides of the sacrificial top electrode;
    forming a silicon oxide adjacent the spacers;
    removing at least a portion of the sacrificial top electrode, forming a cavity;
    forming inner spacers, adjacent the spacers, in the cavity; and
    forming a top electrode in the cavity.

2. The method according to claim 1, comprising forming the STI regions extending in a first direction and forming the RRAM liner extending in a second direction perpendicular to the first direction.

3. The method according to claim 1, comprising:
    removing all of the sacrificial top electrode prior to forming the inner spacers; and
    forming the inner spacers adjacent a bottom section of the spacers.

4. The method according to claim 1, comprising:
    removing one third of the sacrificial top electrode prior to forming the inner spacers;
    forming the inner spacers adjacent a top section of the spacers;
    etching fins below the spacers subsequent to forming the inner spacers; and
    forming the top electrode subsequent to etching the fins.

5. The method according to claim 1, comprising forming the RRAM liner to a thickness of 1 nanometer (nm) to 100 nm.

6. The method according to claim 1, wherein the RRAM liner comprises an oxide of a transition metal.

7. The method according to claim 1, comprising forming the inner spacers by:
    conformally depositing silicon dioxide (SiO2); and
    blanket etching the SiO2.

8. A method comprising:
    defining a shallow trench isolation (STI) region in a substrate;
    implanting dopants in the substrate to form a well of a first polarity around and below a bottom portion of the STI region, a channel of a second polarity over the well on opposite sides of the STI region, and an active area of the first polarity over each channel of second polarity at the surface of the substrate;
    forming an RRAM liner on the active area and STI region;
    forming a top electrode on the RRAM liner;
    forming spacers on opposite sides of the top electrode and RRAM liner;
    implanting a dopant of the second polarity in the active area on opposite sides of the top electrode;
    forming a silicon oxide adjacent the spacers;
    removing a portion of the top electrode, forming a first cavity;
    forming inner spacers, adjacent the spacers, in the cavity;
    etching fins below the inner spacers, forming a second cavity;
    filling the second cavity with an interlayer dielectric;
    removing the inner spacers; and
    filling the first cavity with metal.

9. The method according to claim 8, comprising forming the STI regions extending in a first direction and forming the RRAM liner extending in a second direction perpendicular to the first direction.

10. The method according to claim 8, comprising removing one third of the top electrode to form the first cavity.

11. The method according to claim 8, comprising forming the RRAM liner to a thickness of 1 nanometer (nm) to 100 nm.

12. The method according to claim 8, wherein the RRAM liner comprises an oxide of a transition metal.

13. The method according to claim 8, comprising forming the inner spacers by:
    conformally depositing silicon dioxide (SiO2); and
    blanket etching the SiO2.

* * * * *